(12) United States Patent
Tormen et al.

(10) Patent No.: US 7,760,435 B2
(45) Date of Patent: Jul. 20, 2010

(54) METHOD OF FABRICATING TRIDIMENSIONAL MICRO- AND NANOSTRUCTURES AS WELL AS OPTICAL ELEMENT ASSEMBLY HAVING A TRIDIMENSIONAL CONVEX STRUCTURE OBTAINED BY THE METHOD

(75) Inventors: Massimo Tormen, Trieste (IT); Alessandro Carpentiero, Trento (IT); Enzo Mario Di Fabrizio, Trieste (IT)

(73) Assignee: Consiglio Nazionale Delle Ricerche-INFM Instituto Nazionale per la Fisica Della Materia, Genoa (IT)

( * ) Notice: Subject to any disclaimer, the term of this patent is extended or adjusted under 35 U.S.C. 154(b) by 251 days.

(21) Appl. No.: 11/816,804

(22) PCT Filed: Feb. 21, 2005

(86) PCT No.: PCT/IT2005/000093

§ 371 (c)(1),
(2), (4) Date: May 21, 2008

(87) PCT Pub. No.: WO2006/087744

PCT Pub. Date: Aug. 24, 2006

(65) Prior Publication Data

US 2008/0252988 A1    Oct. 16, 2008

(51) Int. Cl.
*G02B 27/10* (2006.01)
*B29D 11/00* (2006.01)
*C03C 15/00* (2006.01)

(52) U.S. Cl. .......................... 359/619; 216/26; 216/27; 216/41; 216/47; 427/532; 264/299

(58) Field of Classification Search ................ 359/619, 359/652; 372/101, 107; 216/26, 27, 41, 216/47, 58, 67, 75, 81; 438/584, 618, 689, 438/692, 694, 703, 735, 738, 745, 750, 753; 264/299, 319; 257/618, 622, 627, 628; 427/162, 427/299, 307, 309, 532
See application file for complete search history.

(56) References Cited

U.S. PATENT DOCUMENTS 6,200,491 B1 *   3/2001   Zesch et al. .................... 216/27

(Continued)

FOREIGN PATENT DOCUMENTS

EP           0 620 201 A2      4/1994

(Continued)

*Primary Examiner*—Loha Ben
(74) *Attorney, Agent, or Firm*—Merchant & Gould P.C.

(57) ABSTRACT

A method is for forming three-dimensional micro- and nanostructures, based on the structuring of a body of material by a mould having an impression area which reproduces the three-dimensional structure in negative form. This method includes providing a mould having a substrate of a material which can undergo isotropic chemical etching, in which the impression area is to be formed. An etching pattern is defined on (in) the substrate, having etching areas having zero-, uni- or bidimensional extension, which can be reached by an etching agent. A process of isotropic chemical etching of the substrate from the etching areas is carried out for a corresponding predetermined time, so as to produce cavities which in combination make up the impression area. The method is advantageously used in the fabrication of sets of microlenses with a convex three-dimensional structure, of the refractive or hybrid refractive/diffractive type, for forming images on different focal planes.

25 Claims, 16 Drawing Sheets

U.S. PATENT DOCUMENTS

| | | | |
|---|---|---|---|
| 7,189,635 B2 * | 3/2007 | Sharma | 438/584 |
| 7,531,120 B2 * | 5/2009 | Van Rijn et al. | 264/299 |
| 2002/0027715 A1 | 3/2002 | Shimizu et al. | |

FOREIGN PATENT DOCUMENTS

| | | |
|---|---|---|
| EP | 0 911 144 A2 | 4/1999 |
| EP | 1 022 108 A1 | 7/2000 |
| JP | 2004012856 | 1/2004 |
| JP | 2004099394 | 4/2004 |

* cited by examiner (a)

(b)

(c)

(d)

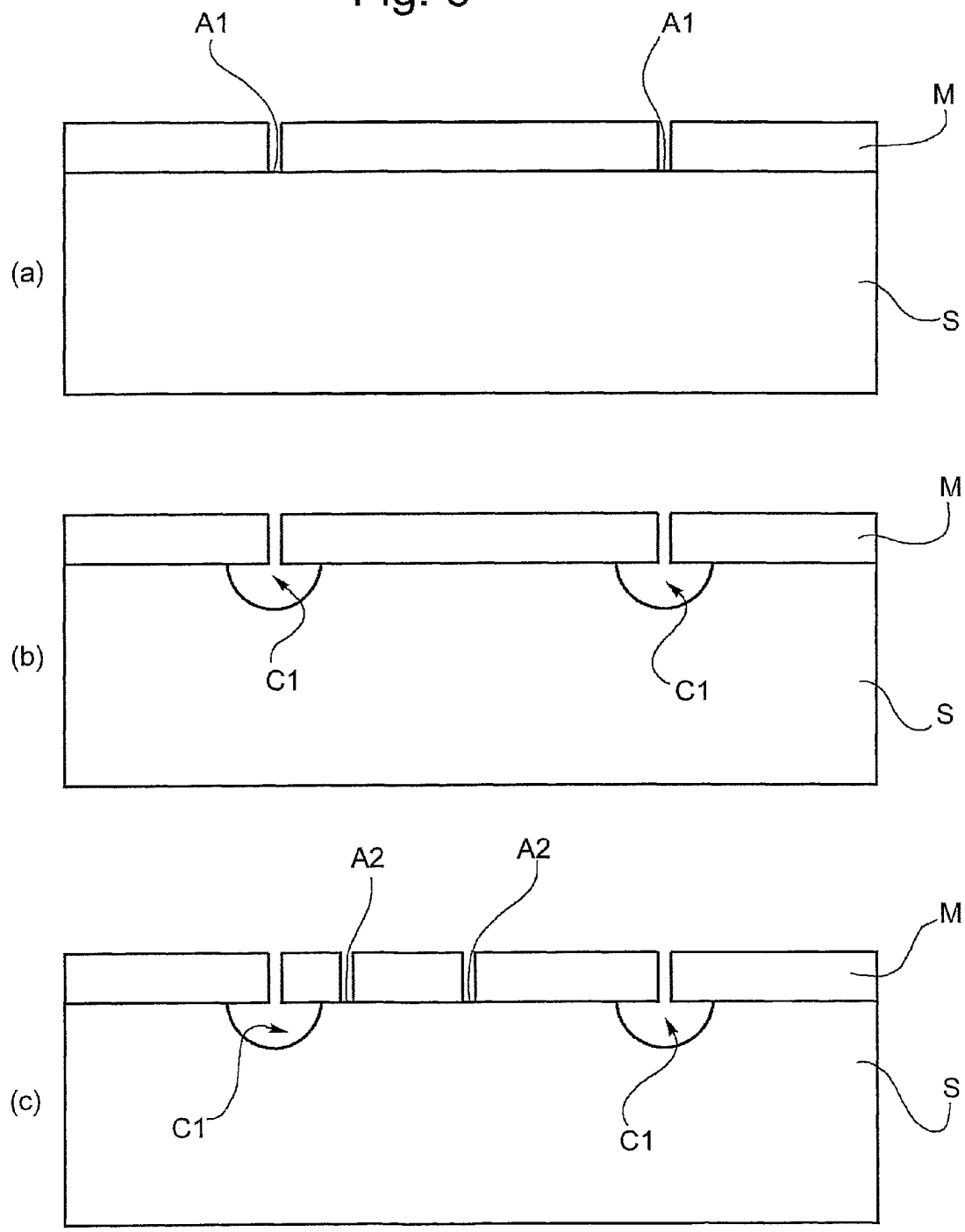

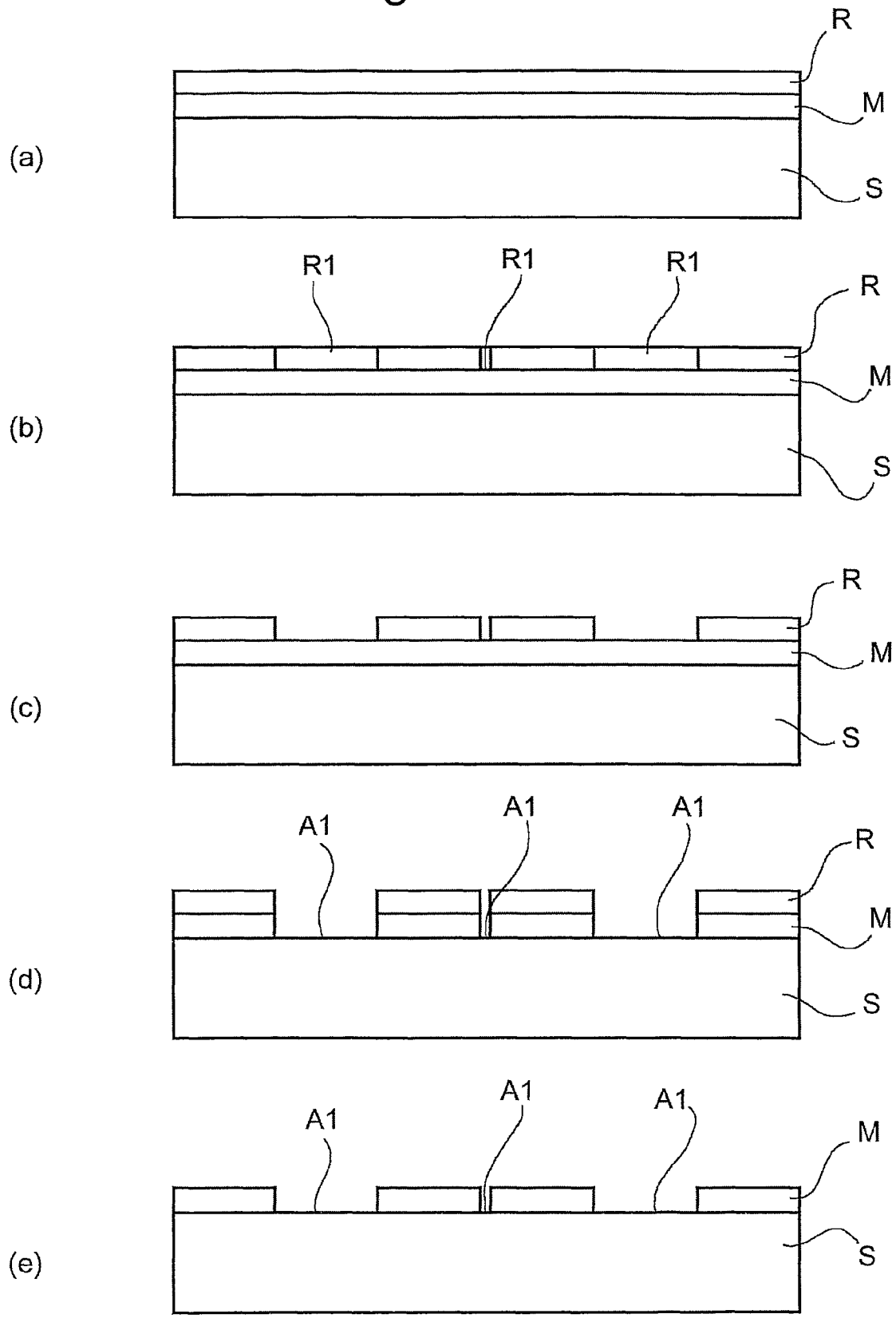

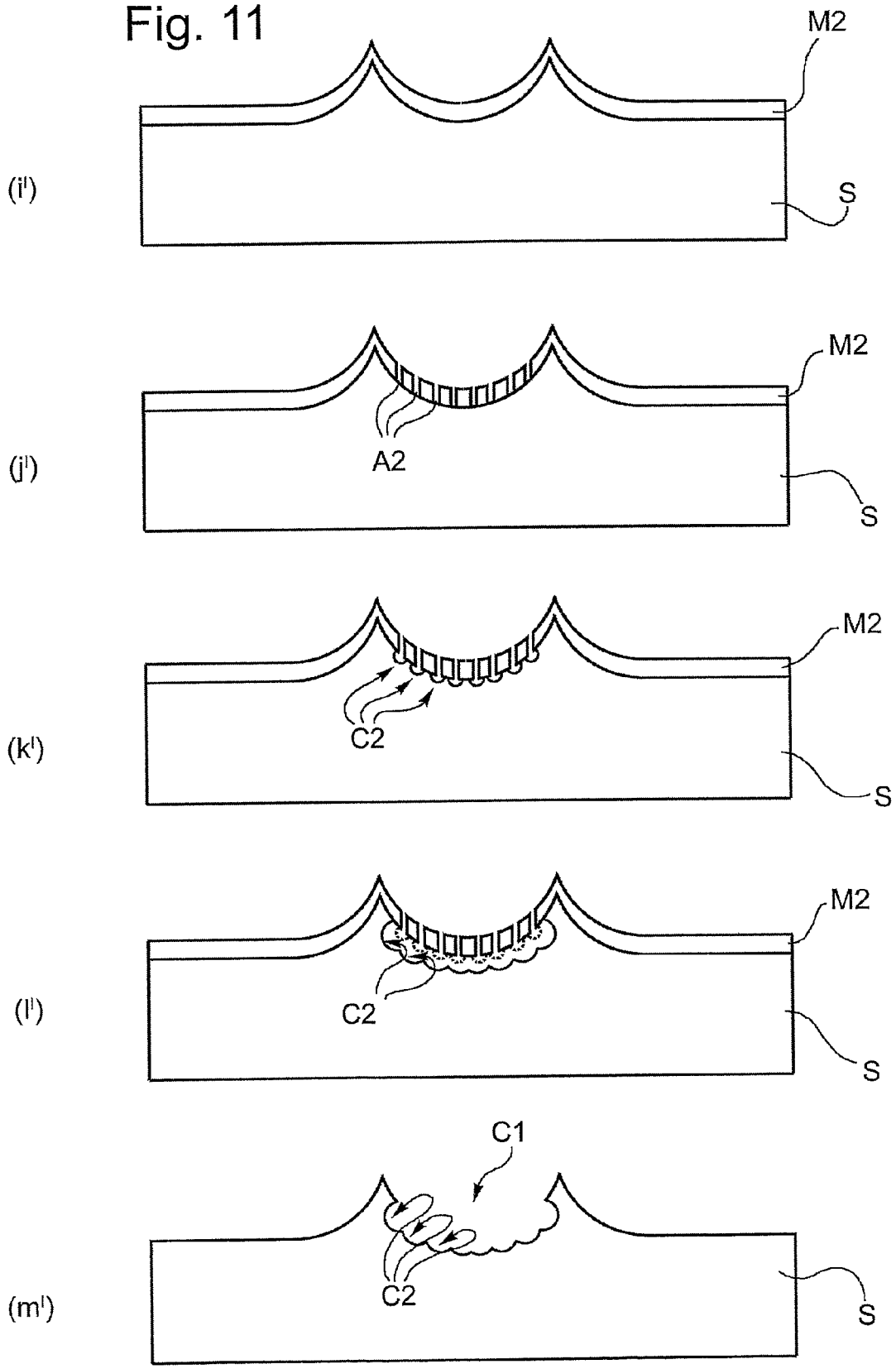

METHOD OF FABRICATING TRIDIMENSIONAL MICRO- AND NANOSTRUCTURES AS WELL AS OPTICAL ELEMENT ASSEMBLY HAVING A TRIDIMENSIONAL CONVEX STRUCTURE OBTAINED BY THE METHOD

BACKGROUND OF THE INVENTION

The present invention relates to the forming of three-dimensional micro- and nanostructures, in particular optical elements of the refractive or hybrid refractive/diffractive type.

More specifically, the invention relates to a method for forming three-dimensional micro- and nanostructures based on the structuring of a body of material, for example a plastics material, by means of a mould having an impression area which reproduces the desired three-dimensional structure in negative form, and a set of microlenses with a convex three-dimensional structure which can be produced by means of this method.

The reduction of the size of devices in the fields of microelectronics, optics, micro- and nanomechanics, microfluidics, and sensor technology—to quote only a few examples—has presented increasing challenges in relation to the improvement of the resolution, accuracy, flexibility and reliability of these devices, and has stimulated research into new micro- and nanofabrication methods.

To quote one example, in the optical field in particular, the fabrication of three-dimensional nanostructures can allow the production of refractive optical elements which can be substituted for the diffractive optics currently used in systems for generating and processing complex images. This would make it possible to overcome the drawbacks of the use of diffractive optics, these drawbacks including an efficiency which is usually below 50%, the generation of disturbances due to orders of diffraction differing from those chosen to implement the desired optical function ("ghost images"), and the necessity of using monochromatic sources having a predetermined emission wavelength, correlated with the pitch of the diffraction grating.

The fabrication of complex three-dimensional micro- and nanostructures, such as convex structures for forming refractive optical elements (microlenses), requires the use of high-precision substrate micro- and nanoprocessing methods.

There are known processing methods based on etching and material removal by means of focused ion beams ("FIB"), which are fairly flexible in respect of the forming of the desired shapes, but are very slow and therefore not suitable for the forming of complex and extensive structures.

There are also known optical lithography or "grey-tone" electron beam methods, whose writing speed is sufficient for the required applications, but which have a low depth of penetration into the materials (typically electronic resists) being processed, and which therefore cannot be used to produce three-dimensional structures having depressions or projections measuring more than a few microns.

One emerging technology is that of nano-imprint lithography ("NIL"), which makes it possible to dispense with the use of beams of energetic particles, such as photons, electrons or ions, for printing a given relief pattern on a plastics material, for example a polymer film.

The general principle of nano-imprint lithography is that of replicating a relief pattern present on the surface of a mould by pressing the latter on a body of mouldable material which is deposited on a substrate, and which can be deformed by pressure. The material tends to fill the cavities of the mould and to match its profile. Finally, the mould is removed, leaving its profile imprinted in the material.

The nano-imprint lithography method, like other methods of forming a plastics material (such as injection moulding) requires a mould which is formed with absolute precision, particularly as regards its imprint area carrying the microstructured or nanostructured profile which is to be replicated in the plastics material.

Advantageously, when the mould has been produced, it can be used in serial production without the need to repeat complex stages of lithography or direct etching of each substrate on which the desired structure is to be fabricated.

SUMMARY OF THE INVENTION

The object of the present invention is to provide a method for forming three-dimensional micro- and nanostructures based on the structuring of a body of material by means of a mould, which makes an efficient use of known lithography technologies and of the costly equipment which is available, while making it possible to produce three-dimensional structures of high quality in terms of both the accuracy of the shape and the surface finish.

Briefly, the method proposed by the invention is based on the structuring of a material (a plastics material, for example) by means of a mould on which is formed an impression which reproduces the desired three-dimensional structure in negative form, exploiting the properties of a process of isotropic chemical etching of the material forming the mould.

The process of isotropic chemical etching can be used to generate in the mould cavities whose surfaces "are propagated" isotropically (in other words through the same distance in all directions) into the mould material (in the same ways as spherical wave fronts in a propagation medium), from each surface element of the mould which can be reached by the etching agent used.

This effect is achieved by preparing a mould formed from a material which can undergo isotropic chemical etching, in other words a material having identical properties of response to etching (in particular, the rate of etching) by a predetermined chemical agent in all directions. The isotropy of the material with respect to chemical etching is always present in non-crystalline materials (amorphous glass, for example) and in some crystalline materials (quartz, for example) depending on the particular etching agent.

The regions of the mould which can be reached by the etching solution (etching areas), from which the cavities forming the impression area of the mould are created, can have a zero-dimensional extension (points), unidimensional extension (lines) or bidimensional extension (flat or curved surface areas which cannot be approximated to points). The lines and surface areas can be defined in any spatial direction.

The isotropic chemical etching process allows for producing hemispherical cavities from a point (zero-dimensional region) of a surface exposed to the chemical etching agent.

By using micro- and nanoprocessing methods based on focused ion beams, as well as lithographic methods, it is possible to accurately define infinite configurations (patterns) of etching areas with zero-, uni- or bidimensional extension, which can be reached by an etching agent. In the context of the present invention, bidimensional etching areas are areas of the original surface of a mould, the inner surfaces of cavities preformed by chemical etching and the walls (lateral and base surfaces) of cavities produced by physical etching in the volume of the mould.

The etching front propagated from uni- or bidimensional regions is determined by the Huygens principle of composition of elementary hemispherical fronts. The concave surfaces produced inside the mould from uni- or bidimensional etching areas therefore constitute the envelopes of elementary theoretical hemispherical concave surfaces generated from the various points constituting those areas.

The material used for the mould is preferably amorphous glass, quartz or other silicon oxide. In this case, the etching agent is preferably based on hydrofluoric acid (HF).

Since hydrofluoric acid is a highly corrosive substance, when the surface of the mould is selectively masked the mask is preferably made from chromium or silicon, which resists corrosion by hydrofluoric acid and shows excellent adhesion to the glass or quartz substrate.

By iterating the sequence of a first step of defining the pattern of etching areas (at the most, the whole surface of the mould) and a second step of isotropic chemical etching of the mould, it is possible to form complex structures, such as adjacent concave formations having different radii of curvature, intersecting, and/or partially overlapping, in the form of hemispheres or spherical segments.

If the isotropic chemical etching step is iterated, the etching steps following the first one can be carried out either from new etching areas or from extended etching areas produced by at least one preceding etching step carried out from pre-existing etching areas.

The etching areas are defined by selective masking of the mould surface in a pattern corresponding to the geometry of the desired areas, or by micro- or nanoprocessing methods for cutting into the substrate (focused ion beam milling, for example).

The control (modulation) of the processes of cutting into the volume of the mould is used to define etching patterns characterized by unidimensional and bidimensional etching areas with variable depths of cut.

Selective masking can be carried out by applying a protective layer to an extended region of the mould surface and selectively removing regions of this layer to expose areas of the mould. The selective removal of the protective layer is carried out by using micro- or nanoprocessing methods for cutting into the substrate, for example by means of focused ion beams or by plasma etching of areas of the mould defined by lithography (optical, electron, or X-ray lithography).

The mould formed in this way can be used advantageously in methods for structuring material, such as thermoplastic or cross-linkable material, based on methods of nano-imprint lithography, injection moulding or step & flash lithography.

In particular, the method proposed by the invention can be used to form optical elements with a convex three-dimensional structure, of the refractive or hybrid refractive/diffractive type, suitable for forming a set of microlenses, for example including a plurality of adjacent, intersecting and/or overlapping lens having different radii of curvature for the formation of images on different focal planes.

BRIEF DESCRIPTION OF THE DRAWINGS

Further characteristics and advantages of the present invention will be revealed more fully in the following detailed description, provided by way of non-limitative example, with reference to the attached drawings, in which.

DETAILED DESCRIPTION OF THE PREFERRED EMBODIMENT(S)

In the remainder of the present description, the method of fabricating three-dimensional micro- and nanostructures proposed by the invention, in its multiple embodiments, is represented by means of a sequence of sectional views of a portion of a substrate of the mould, indicated by S, consisting of a material for which an isotropic chemical etching process is known, for example and preferably quartz, on which an impression area is formed, in the most significant stages of the method.

Figure 1:
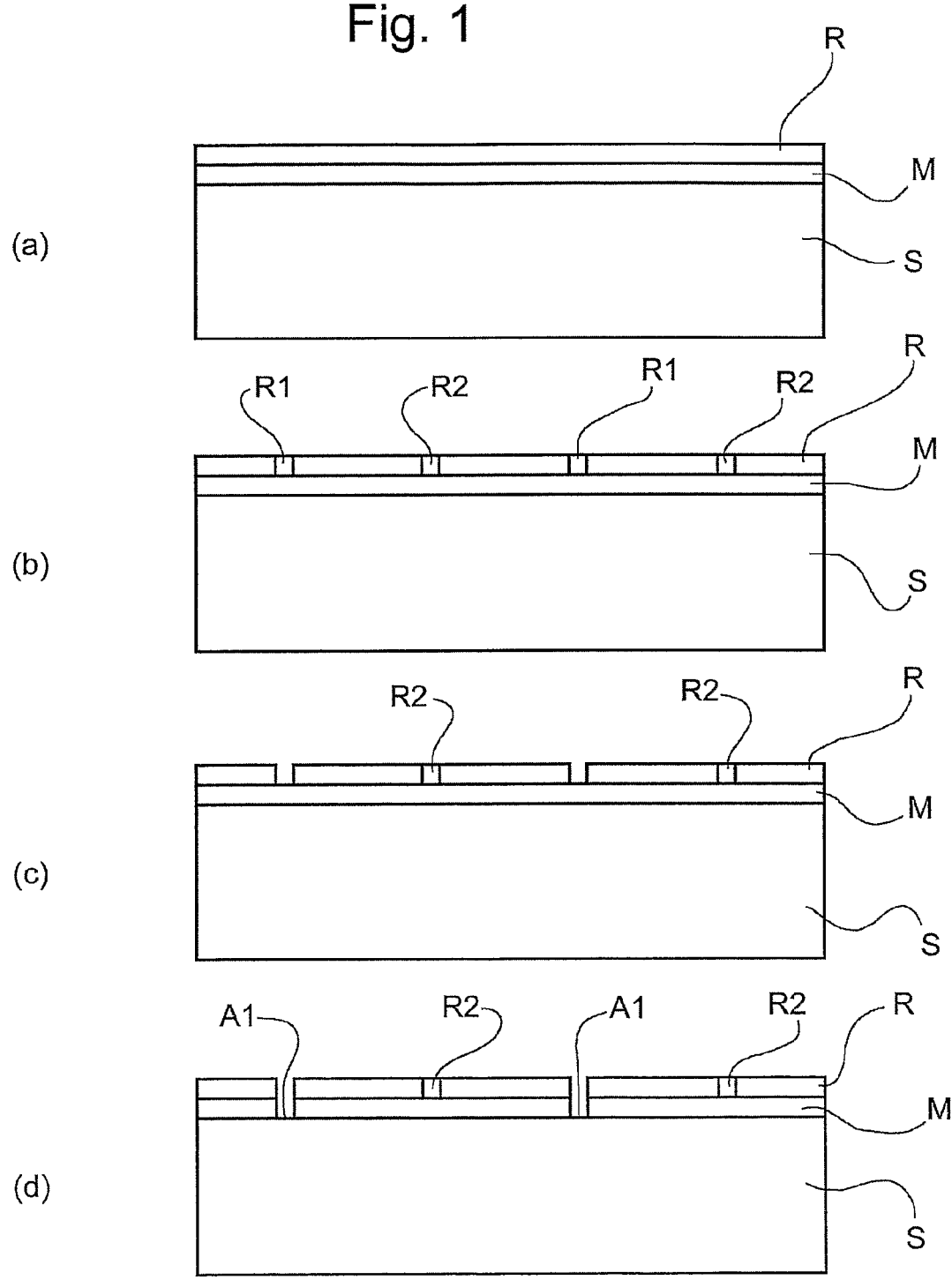
FIG. 1 shows in succession a series of steps of a method for fabricating three-dimensional micro- and nanostructures according to a first embodiment of the present invention.
Figure 1:
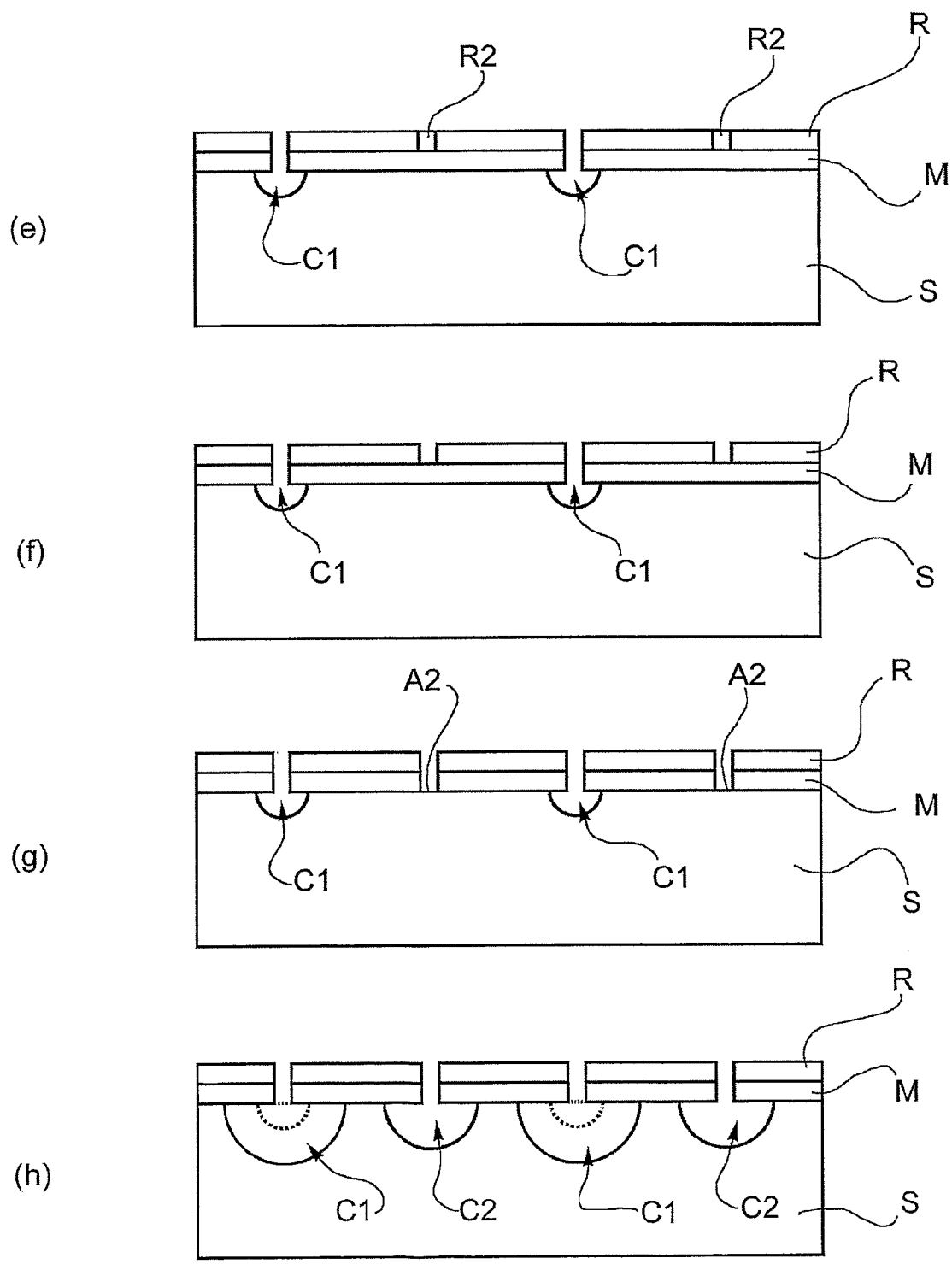
Figure 1:
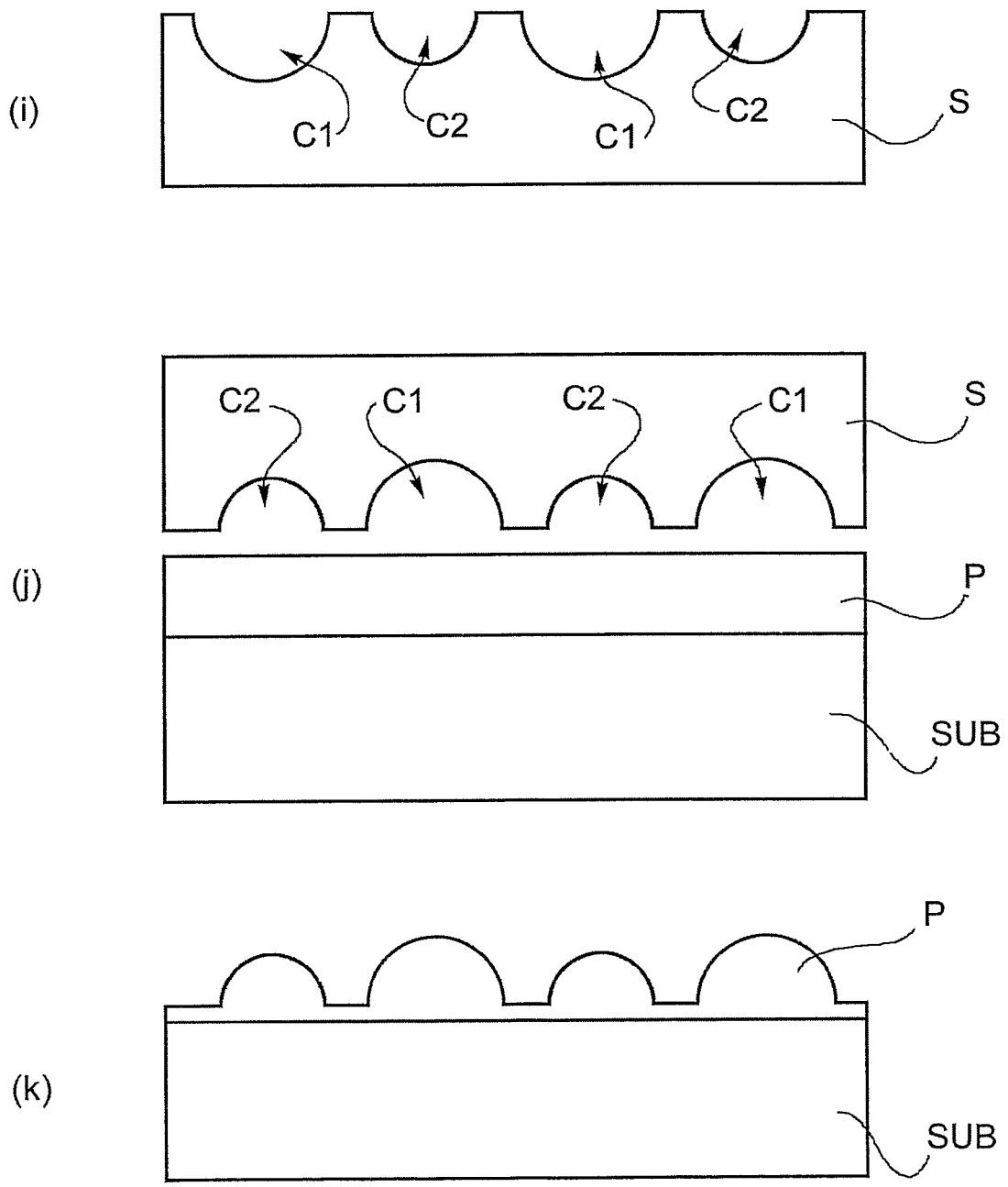

FIG. 1 shows a sequence of steps of a method for fabricating three-dimensional micro- and nanostructures according to a first embodiment of the invention.

This method can be used advantageously for forming an array of spherical microlenses, for example one comprising two types of lens with different radii of curvature, positioned with an alternating distribution.

In a first step (FIG. 1(a)) a quartz substrate S is provided, on which is to be formed an impression area which reproduces in negative form the three-dimensional structure of the desired array of microlenses. A first protective layer M of chromium and a subsequent layer of resist, for example PMMA, indicated by R, are deposited on the substrate.

The layer of resist is exposed to electron beams with different doses (in practice, this is achieved by controlling the exposure time), for example 400 and 180 $\mu C/cm^2$, so that it is exposed in different ways in the regions R1 and R2 (FIG. 1(b)).

A first step of development of the resist with a mild solvent, for example isopropyl alcohol (IPA), is then carried out, to develop the regions of resist R1 which have been highly exposed to the electron beam. FIG. 1(c) shows a step of the process in which the developed regions of resist have been removed, exposing the chromium protective layer M.

A step of selective removal (by chemical etching using ammonium cerium nitrate/acetic acid, for example) of the chromium is then carried out (FIG. 1(d)), resulting in the exposure of first etching areas A1 on the surface of the substrate S. These areas may have zero-dimensional, unidimensional or bidimensional extension. In the figures, purely by way of example, the areas A1 are considered to be zero-dimensional areas (single points).

FIG. 1(e) shows the next step of isotropic chemical etching of the quartz substrate S. It takes place from the etching areas which have been exposed, and which can therefore be reached by the predetermined etching chemical agent, for example HF in the case of quartz substrates, and causes the formation of first cavities C1. In the case of zero-dimensional etching areas, these cavities are perfectly hemispherical. In the case of uni- or bidimensional areas, these cavities are the result of the isotropic propagation of the etching front and can be considered as the envelopes of elementary hemispherical surfaces generated by etching from each point constituting the initial etching area.

At this point, the second regions of resist R2, which have been mildly exposed, are removed by means of a strong solvent, for example a mixture of methylisobutylketone and isopropyl alcohol (MIBK:IPA, in a ratio of 1:3). In this way, corresponding regions of the protective layer M are uncovered (FIG. 1(f)) and are then selectively removed to expose second etching areas A2 on the surface of the substrate S (FIG. 1(g)). It should be noted that, in the case of selective removal of the protective layer of Cr by chemical etching, the etching agent used has no effect on the exposed areas of the substrate S, which are therefore not etched further.

FIG. 1(h) therefore shows a second step of isotropic chemical etching of the substrate, which takes place from the surfaces of the cavities C1 previously formed, and from the new etching areas A2. This operation results in the formation of hemispherical cavities at the etching areas A2 and the expansion of the previously formed hemispherical cavities C1.

The removal of the residual layer of resist R and protective layer M results in the finished mould, shown in FIG. 1(i), which clearly reveals the impression area consisting of a plurality of concave formations.

Finally, the nanostructuring method is completed by using the nano-imprint lithography method by which the mould produced as above is inverted and pressed on a body of deformable plastics material P, for example a polymer such as a cyclic polyolefin, Zeonex, in the form of a film of material deposited on a substrate SUB having mechanical support properties (FIG. 1(j)).

As shown in FIG. 1(k), the plastics material P adapts itself to the profile of the mould. Lastly, the mould is removed, leaving its profile imprinted in the body of polymer material, which thus has a plurality of convex three-dimensional micro- or nanostructures.

In the embodiment described, these structures form spherical microlenses with different radii of curvature, enabling images to be formed on different focal planes.

The optics which can be formed by the method proposed by the present invention are suitable for applications which are not limited to those described, in which microlenses with different radii of curvature and numerical apertures are incorporated on a single substrate, but which potentially include the following (this list being purely for guidance and non-restrictive):

- unidimensional or bidimensional arrays of microlenses for use in lasers (collimators or concentrators in vertical-cavity surface-emitting lasers, (VCSEL)), concentrators for photovoltaic applications (particularly with the "Winston concentrator" geometry) for "light harvesting", and waveguide splitters;
- the creation of spherical and aspherical (multifocal, cylindrical, toroidal) lenses, arrays of focusing refractive micromirrors, special lenses for phase contrast microscopy;
- the fabrication of optical tweezers and similar linear light guide systems for trapping and moving microscopic objects by means of light intensity gradients;
- the production of high-efficiency photon gratings in the spectral range between infrared and X-rays;
- the production of high-efficiency illuminating systems, optical beam-forming systems, and imaging systems with composite lenses modelled on insect eyes, based on the possibility of producing arrays of lenses in compact arrangements, in other words without unused parts of their support surfaces (refractive surfaces- without continuity solutions);
- the production of neutron optics;
- the production of hybrid refractive/diffractive optics.

Figure 2:
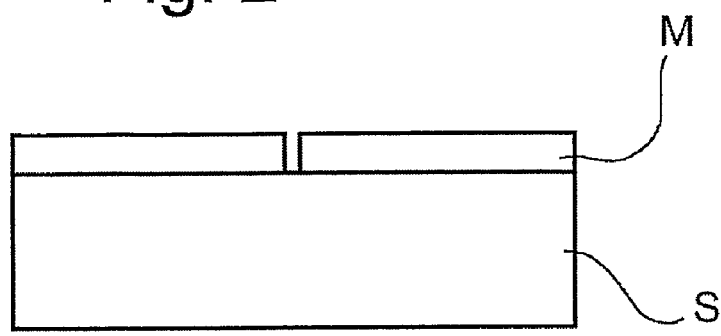
FIG. 2 shows some exemplary steps of fabrication on which the method proposed by the present invention is based.
Figure 2:
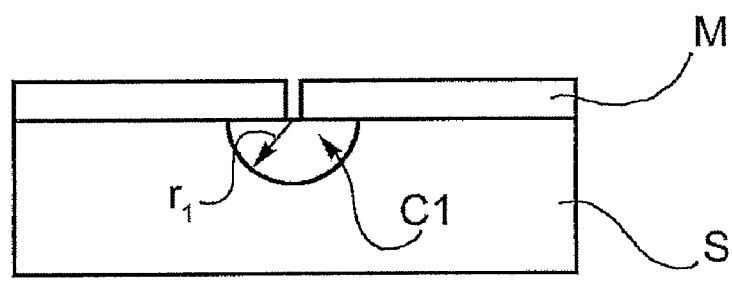
Figure 2:
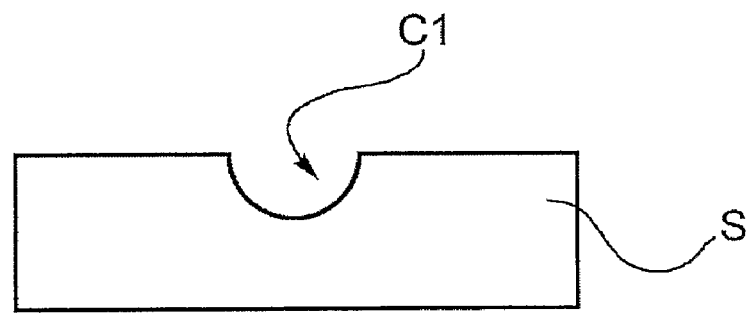
Figure 2:
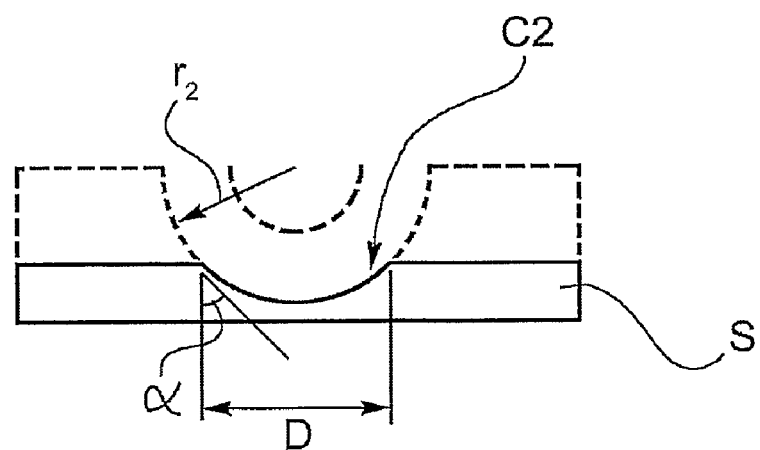

FIG. 2 shows schematically an example of the isotropic chemical etching process on which the invention is based, for the independent control of the radius of curvature and the diameter of the concave structures being formed on a mould.

The pictures in FIGS. 2(a) and 2(b) show a step of definition of an etching area on the substrate S, by the selective removal (chemical or physical etching) of a portion of a protective layer M, for example a layer of chromium, positioned to mask a substrate, quartz for example, to be processed, and a subsequent step of isotropic chemical etching of the quartz substrate for a time $t_1$ up to the creation of a first hemispherical cavity C1.

The radius of curvature $r_1$ of the cavity formed in this way can be calculated by means of the formula:

$$r_1 = v t_1$$

where v is the rate of etching of the substrate, which is a function of the material and the predetermined etching agent.

The removal of the protective or masking layer M results in the exposure of the mould substrate S shown in FIG. 2(c), ready for the structuring of a thermoplastic material in the form of a hemispherical dome.

More complex structures are obtained by iteration of the steps of definition of the etching areas and isotropic chemical etching.

FIG. 2(d) shows, by way of example, the progress of the processing of the impression area of the mould by a second step of isotropic chemical etching for a period of time $t_2$. In this case, the etching takes place over the whole exposed surface of the substrate S, in other words from the surface of the cavity C1 and also from the surrounding areas. This causes, in the first place, a reduction of the thickness of the substrate, and the enlargement of the pre-existing spherical cavity C1. Thus the radius of curvature of the spherical cavity becomes $r_2 > r_1$, and can be calculated by means of the formula:

$$R_2 = v(t_1 + t_2)$$

where v denotes the rate of etching of the substrate, $t_1$ the etching time before the removal of the masking layer M and $t_2$ the etching time after the removal of the masking layer.

This processing method can be used to produce an enlarged cavity C2 which is not hemispherical, but takes the form of a spherical segment, and to form an impression area on the mould for structuring the plastics material in the form of a spherical dome.

The base diameter D of the cavity in the form of a spherical segment, as a function of which the numerical aperture of a corresponding moulded dome lens can be determined, can be controlled independently of its radius of curvature by controlling the etching time in the first and second etching steps, according to the following formula:

$$D = 2v[(t_1^2 + 2t_1 t_2)]^{1/2}$$

while the angle α at the base of the spherical segment is determined by the equation:

$$\alpha = \arcsin(t_1/(t_1 + t_2)).$$

Figure 3:
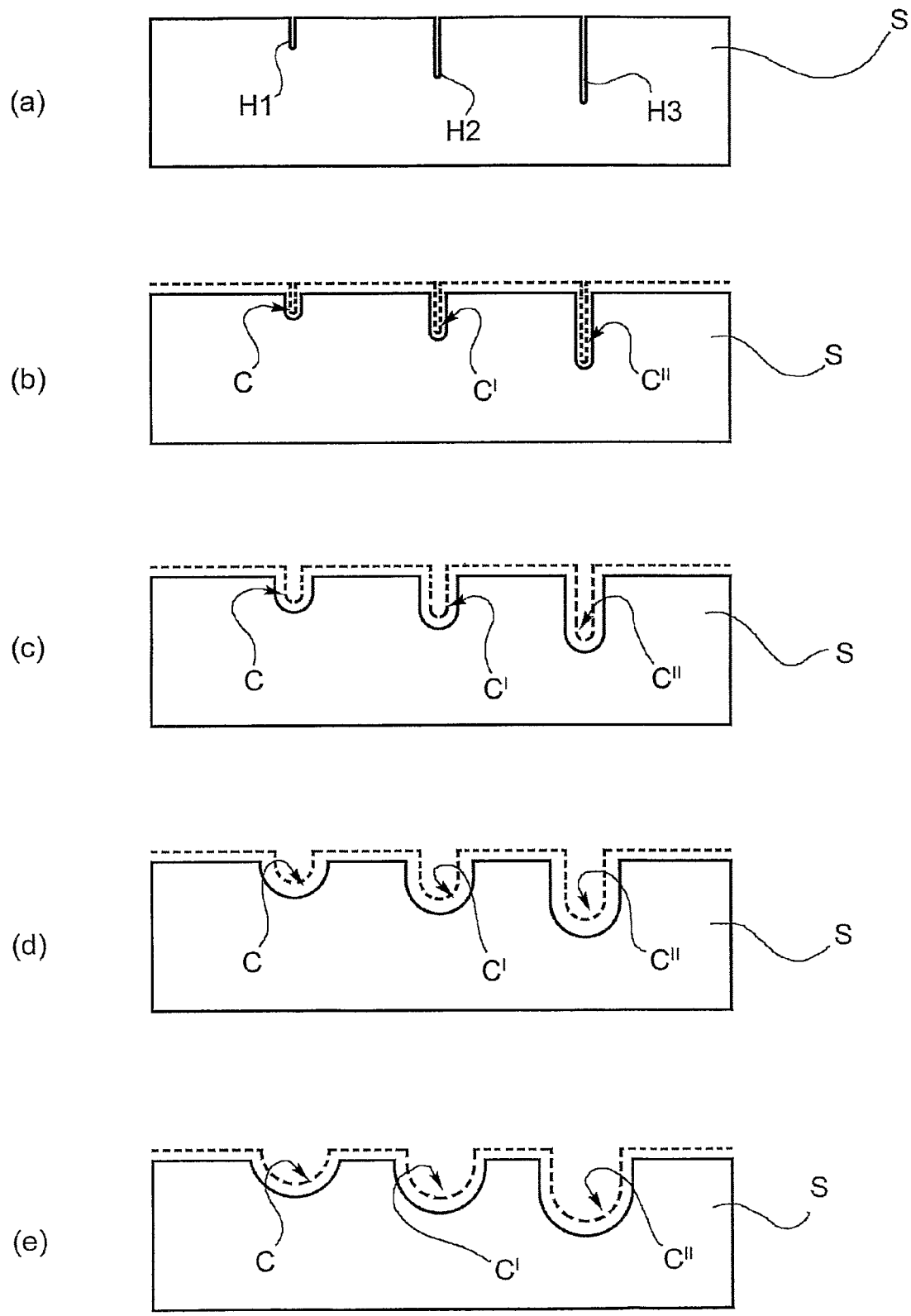
FIG. 3 shows in succession a series of steps of a method for fabricating three-dimensional micro- and nanostructures in a second embodiment of the present invention.

FIG. 3 shows the steps followed to form a different impression area on a mould, in which a single isotropic chemical etching process is associated with a focused ion beam (FIB) milling process, and the shapes of the impression area can be defined accurately by controlling the duration of the etching process.

FIG. 3(a) shows a substrate S of a mould, made for example from quartz or other silicon oxide, without masking, in which three drilled holes have been formed to different depths, for example by physical etching (milling) by means of a focused ion beam (for example, $Ga^+$), with control of the time for which the beam is applied.

In this way it is possible to form cut holes with variable depths corresponding to points, lines or areas of the surface of the substrate.

FIG. 3(a) shows three pits H1, H2, H3 having different depths and zero-dimensional cross sections.

FIGS. 3(b)-3(e) show the progress of a subsequent step of isotropic chemical etching. In this case, the etching areas exposed to the chemical etching agent are the top surface of the substrate and the walls of the etched pits H1, H2, H3. As the exposure to the etching process increases, the thickness of the substrate S is progressively reduced and the previously drilled pits H1, H2, H3 are simultaneously enlarged.

By controlling the duration of the etching process and the initial drilling depth, it is possible to control the formation of cavities C, C', C" to obtain cavities in the form of spherical segments, hemispherical cavities or cylindrical tubular cavities with hemispherical bottoms, according to the height at which the progressively etched top surface of the quartz substrate intersects the cavity being formed. Thus it is possible to control the diameter of the aperture and the radius of curvature of the cavities.

The aperture diameter of the cavities can be calculated according to the following formulae:

$$D = 2vt \quad \text{if} \quad vt \leq H$$
$$D = 2v\sqrt{t^2 - \left(t - \frac{H}{v}\right)^2} \quad \text{if} \quad vt \geq H$$

where t is the duration of the etching and H is the initial depth of the etching.

Figure 5:
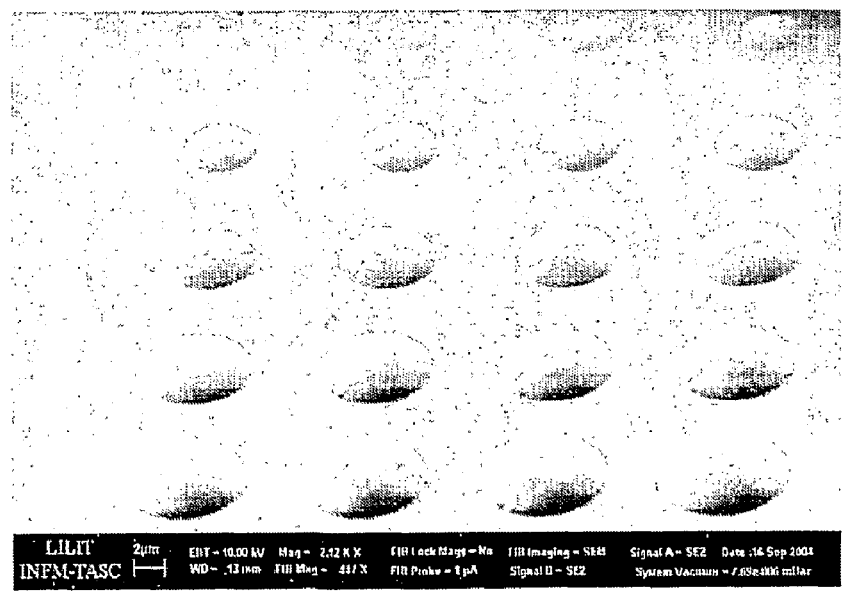

The structuring (not shown) of a polymeric plastics material (for example SU8) by means of a mould formed in this way makes it possible to obtain arrays of microlenses, as shown in FIG. 5, with different focal planes and with different light intensities at the focal points. The focal distance of such lenses can easily be adjusted over a range of 2-200 micrometers.

Figure 4:
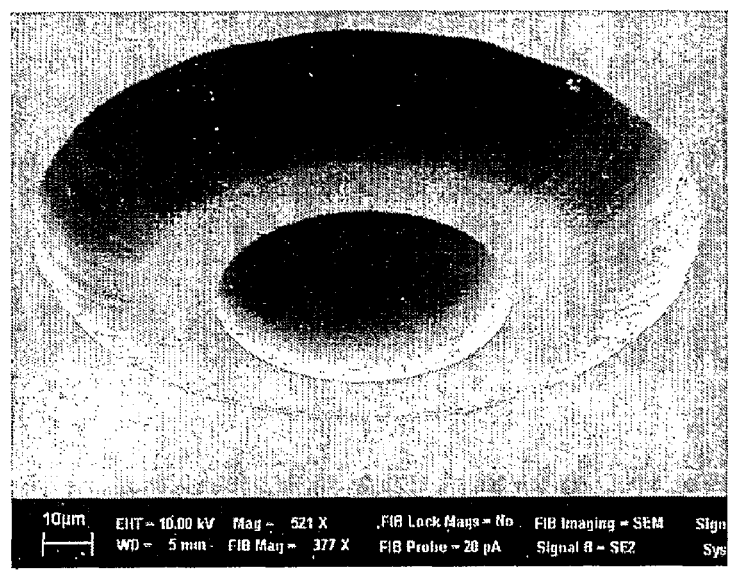
FIGS. 4 and 5 are images, respectively, of a mould and of a nanostructured device such as an array of microlenses.

On the other hand, FIG. 4 shows an example of a mould which can be produced by the method of FIG. 1 or 2, in which a second, smaller spherical cavity is formed in the flat base of a first cavity.

FIG. 5 shows an array of lenses of different diameters formed by means of a mould fabricated according to the process steps shown schematically in FIGS. 3(a)-3(e).

Figure 6:
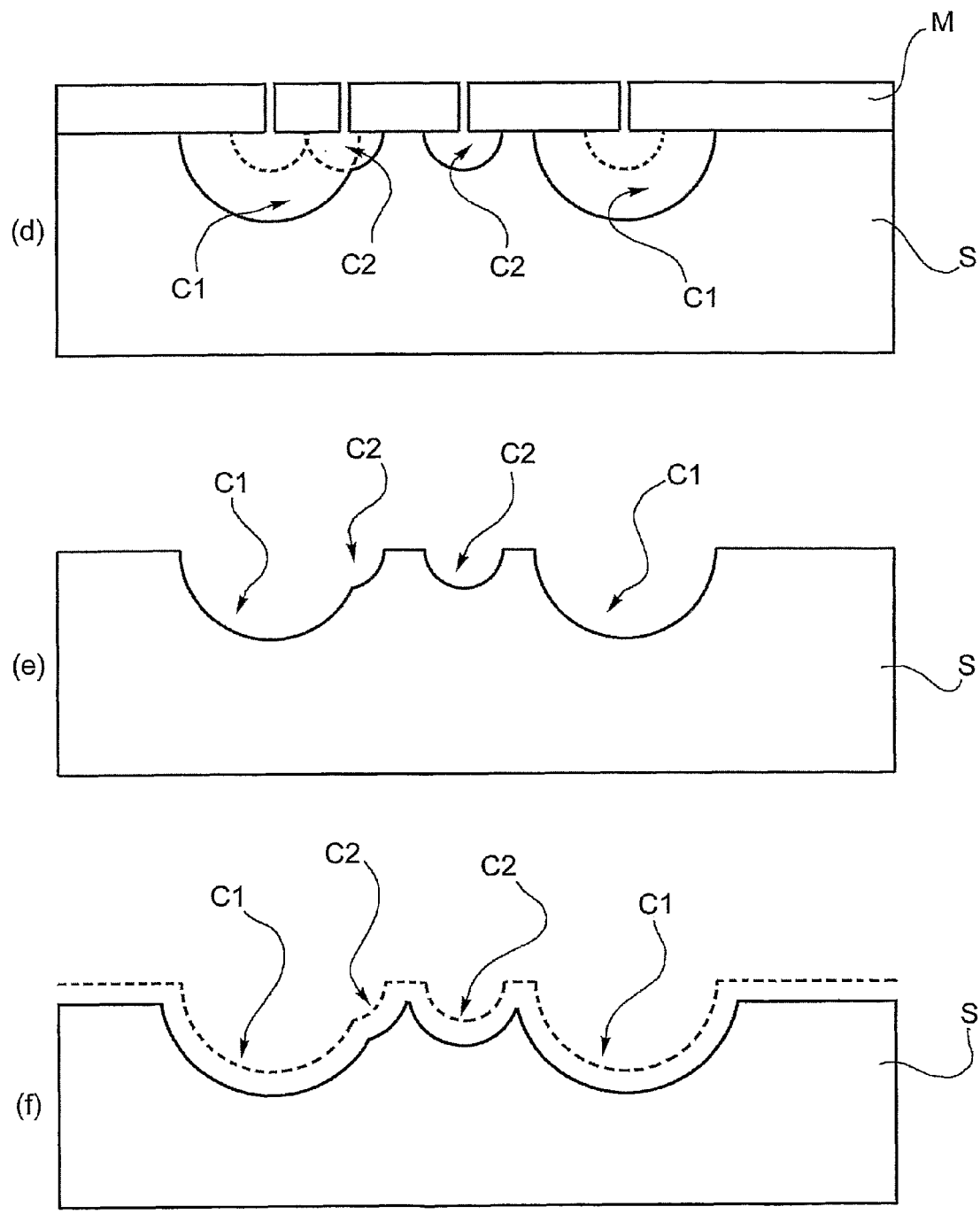
FIG. 6 shows in succession a series of steps of a method for fabricating three-dimensional micro- and nanostructures according to a third embodiment of the present invention.

FIG. 6 shows steps of the fabrication of a mould with intersecting cavities for forming interpenetrating three-dimensional structures.

FIG. 6(a) shows a quartz substrate S on which is placed a protective or masking layer M on which has been formed an etching pattern comprising a pair of first etching areas A1.

The execution of a step of isotropic chemical etching of the substrate S causes the formation of a corresponding pair of cavities C1 as in FIG. 6(b).

Second etching areas A2 are then formed on the substrate, providing a secondary etching area pattern comprising the second areas A2 and enlarged etching areas corresponding to the hemispherical surfaces of the cavities C1 (FIG. 6(c)).

The etching areas can be defined, for example, by electron beam lithography and subsequent chemical etching of the chromium protective layer or by cutting into the protective layer by focused ion beam methods.

A second step of isotropic chemical etching of the substrate, shown in FIG. 6(d), causes the enlargement of the cavities C1 and the formation of second cavities C2. In this particular pattern, some cavities C2 can intersect with pre-existing cavities C1, thus combining to form complex cavities produced by the intersection or overlapping of cavities.

FIG. 6(e) shows the substrate and the corresponding impression area following the removal of the protective layer M.

At this point it is possible to carry out a further step of isotropic chemical etching which undermines a layer of the original surface of the substrate S and additionally enlarges the cavities C1 and C2.

FIG. 6(f) shows the mould at the end of the processing procedure.

Figure 7:
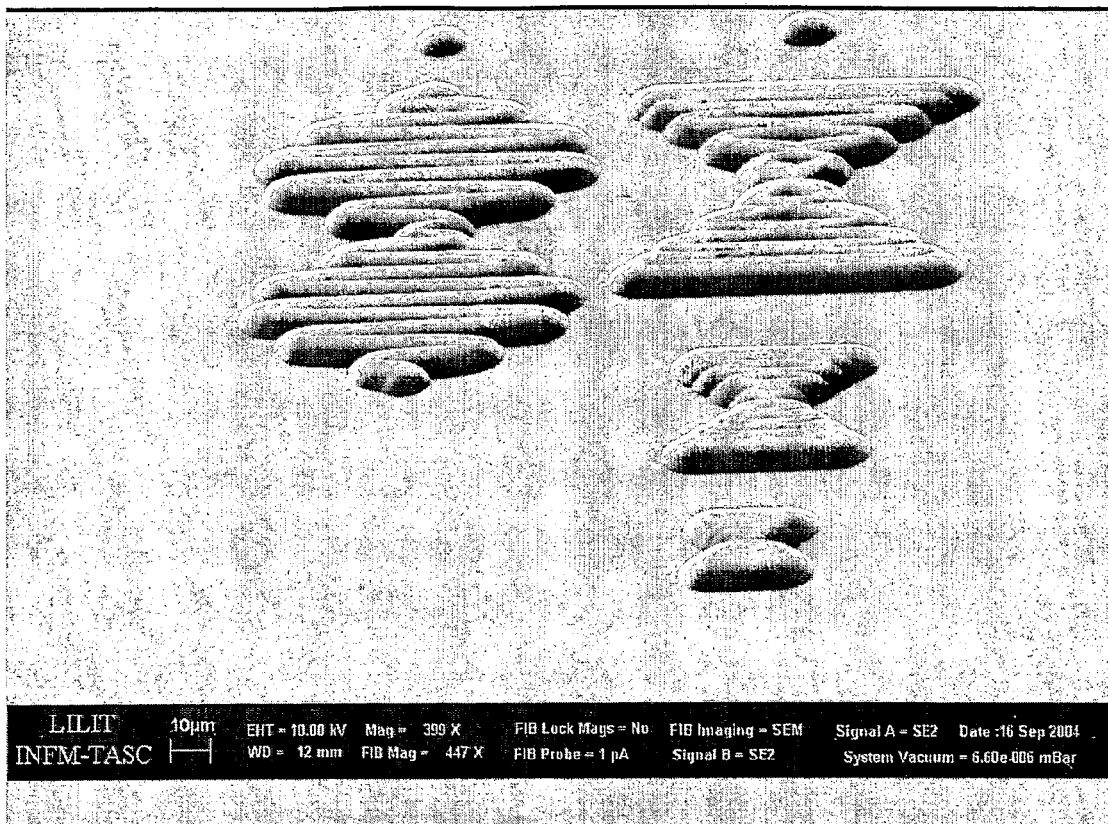
FIGS. 7 to 10 are further images of nanostructured devices.
Figure 8:
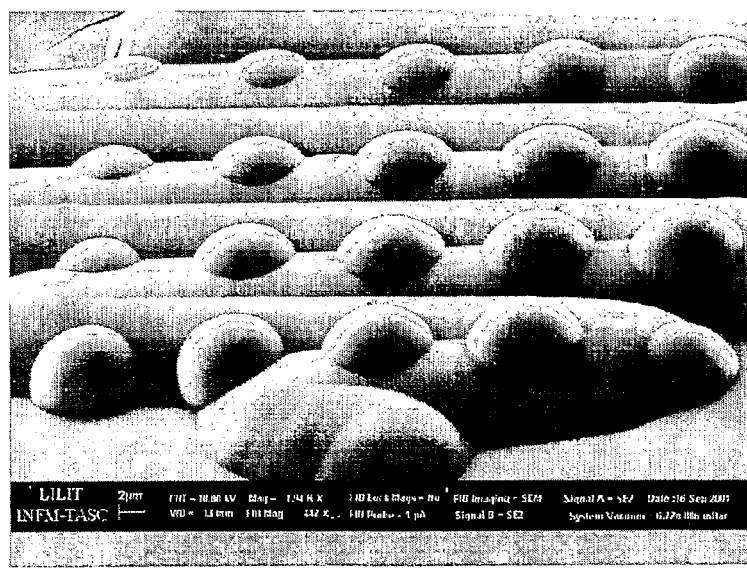

The sequence of steps which has been described can be used to produce complex three-dimensional structures such as those shown in FIGS. 7 and 8. FIG. 7 shows by way of example three-dimensional relief structures, which are locally cylindrical and curved in the form of an amplitude-modulated sinusoid, and which can be produced from a mould processed with a single step of isotropic chemical etching. FIG. 8 shows a portion of a locally cylindrical convex three-dimensional structure similar to that of FIG. 7, on which additional spherical or hemispherical dome formations are created, and which can be produced from a mould processed with two or more steps of isotropic chemical etching following steps of definition of corresponding etching areas.

Figure 9:
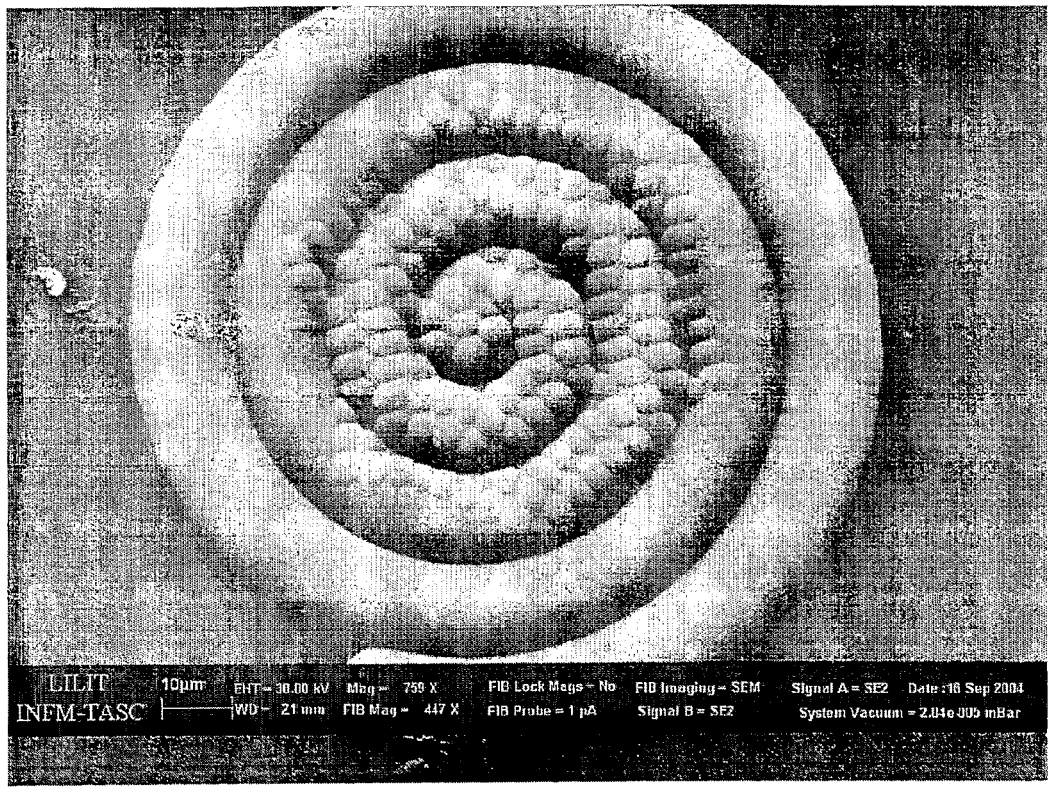
Figure 10:
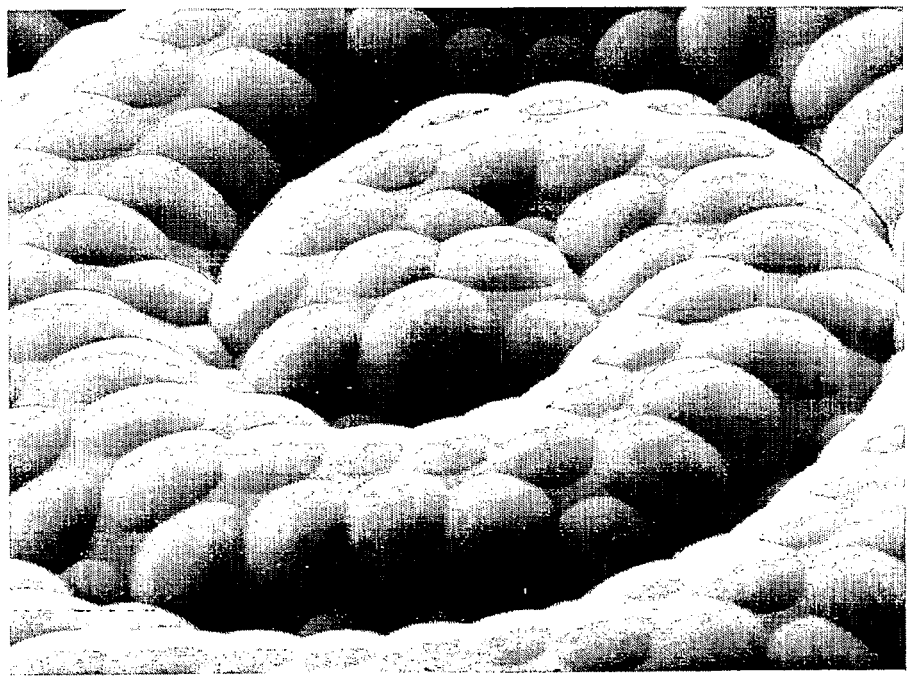

FIGS. 9 and 10 show three-dimensional structures produced by a similar method in which bubble formations of the spherical dome type are formed on a convex base structure with a spiral configuration.

The method proposed by the invention can be applied advantageously for the formation of complex three-dimensional structures, such as sets of microlenses which reproduce the compound eyes of insects.

A method of forming a mould for structuring a plastics material in order to reproduce a lens structure which reproduces the structure of compound eyes of insects is described below with reference to FIG. 11.

FIG. 11(a) shows a substrate S covered with a first protective or masking layer M and a subsequent upper layer of resist R. As in the preceding examples, the substrate can be a quartz substrate, the protective layer M can be formed from chromium and the resist can be PMMA.

FIG. 11(b) shows a first step of exposure of the resist to a localized electron beam, and R1 indicates the exposed regions of resist.

The resist is then developed and removed (FIG. 11(c)) to expose corresponding areas of the protective layer M, which is subjected to chemical etching to define etching areas A1 on the surface of the substrate S (FIG. 11(d)).

The whole layer of resist R is then removed (FIG. 11(e)) and a first step of isotropic chemical etching of the substrate S is carried out through the mask of the protective layer M, to form cavities C1, as shown in FIG. 11(f)).

The removal of the protective layer M makes it possible to obtain a first impression area of the mould, shown in full in FIG. 11(g). A central portion of this, shown more clearly on an enlarged scale in FIG. 11(h), is then processed further.

This portion undergoes an iteration of the steps of defining etching areas and subsequent isotropic chemical etching of the substrate. This iteration can be based on the sequence of any lithographic method capable of modifying the pattern of the etching areas, with isotropic chemical etching starting from these modified areas.

Figure 11:
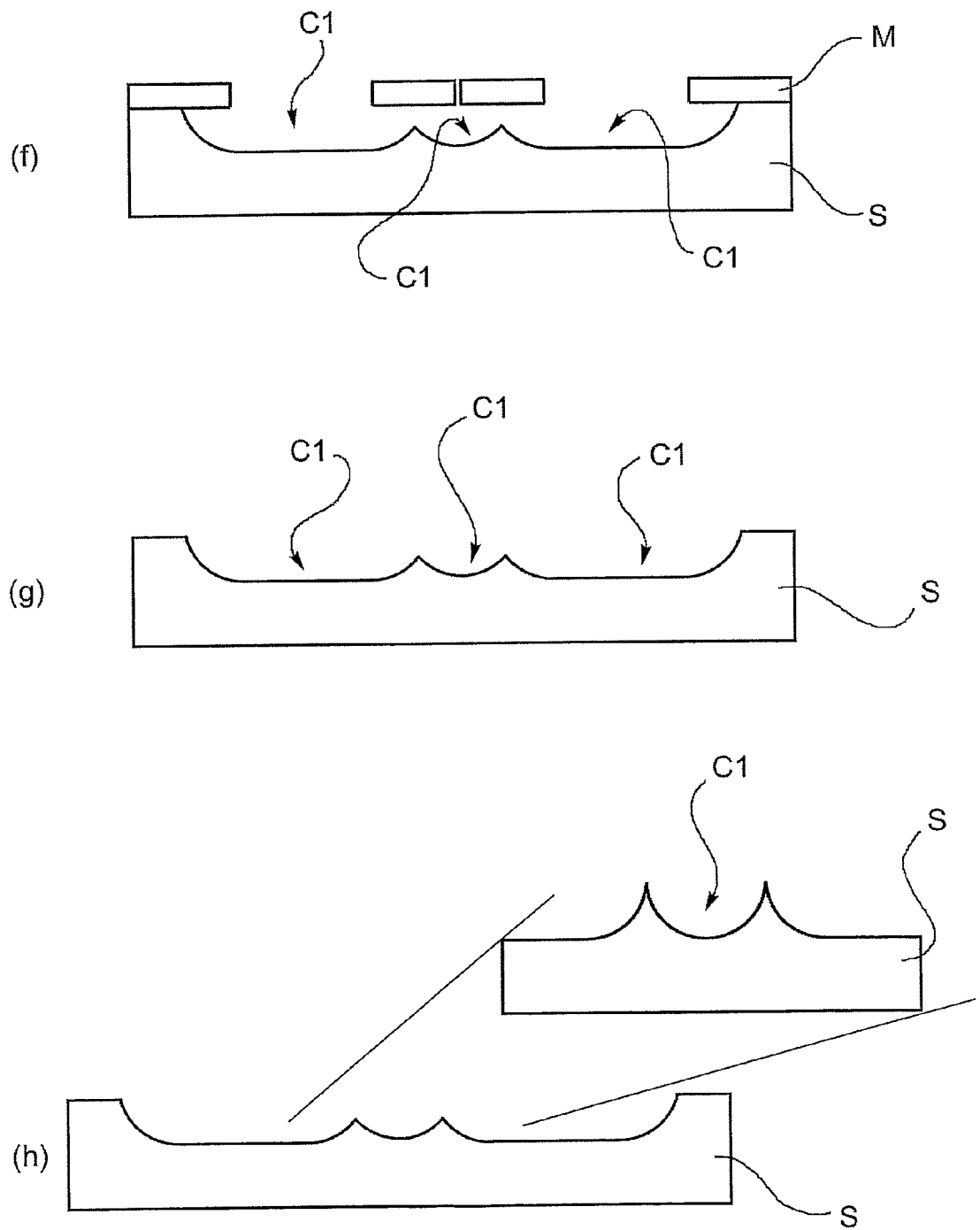
FIG. 11 shows in succession a series of steps of a method for fabricating three-dimensional micro- and nanostructures according to a fourth embodiment of the present invention, in two variants.
Figure 11:
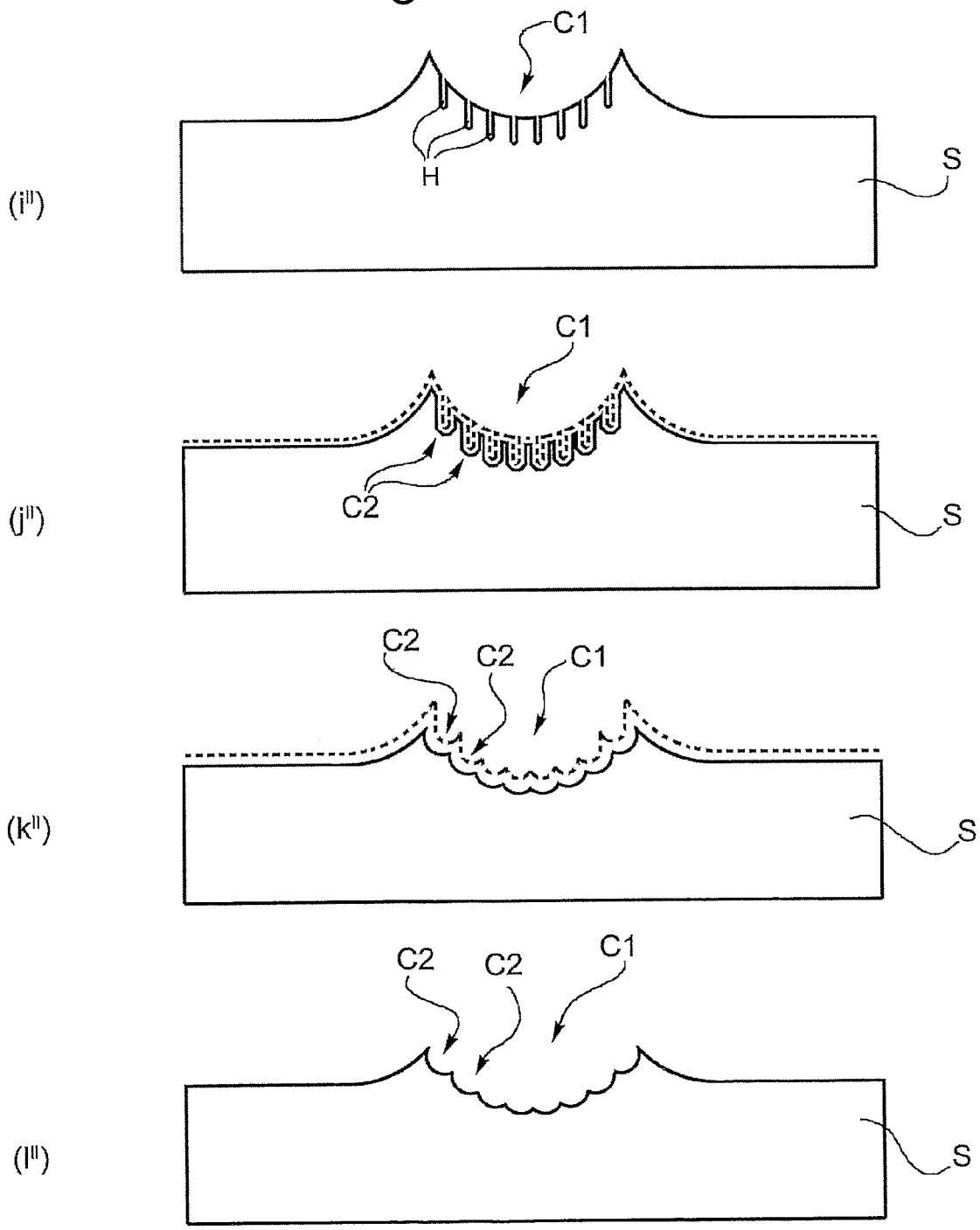

FIGS. 11(i')-11(m') show the sequence of processing steps in a first method, while FIGS. 11(i")-11(l") show the sequence of processing steps in a different method.

In FIG. 11(i'), the substrate S is covered with a coating layer M2, preferably silicon, for example by a step of chemical vapour deposition PECVD.

A plurality of holes is formed in the layer M2, by focused ion beam milling methods for example, to expose a pattern of second etching areas A2 of the substrate S on the hemispherical surface of the cavity C1 produced earlier (FIG. 11(j')).

A step of isotropic chemical etching is then carried out (FIGS. 11(k'), 11(l')) to form microcavities C2 within the principal cavity C1.

The removal of the silicon mask M2, by means of a KOH solution for example, makes the final mould available as illustrated in FIG. 11(m').

Figure 12:
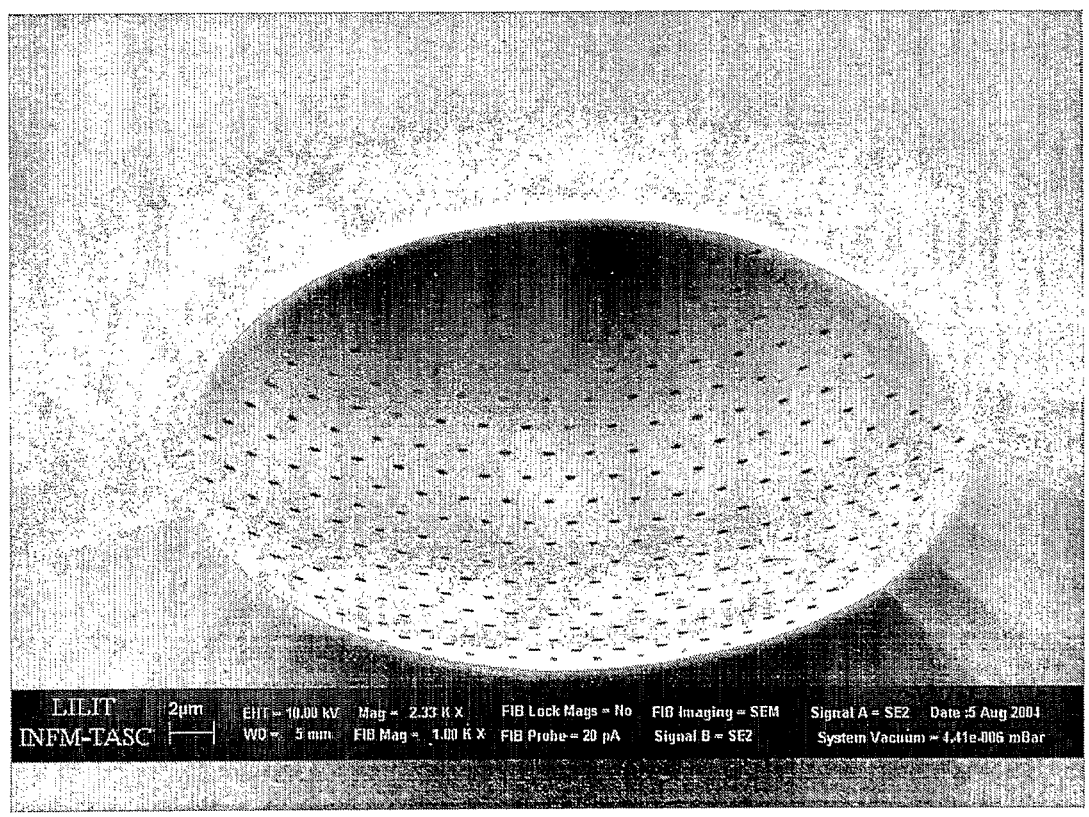
FIGS. 12 to 14 are images showing different stages of fabrication of a set of microlenses produced by the method of FIG. 11.

A similar impression area can be produced by a different method, without applying a masking layer M2, by simple direct cutting into (FIG. 11(i")) of the substrate. In this way a plurality of pits H is produced from the surface of the cavity C1, forming a structure shown in FIG. 12.

A subsequent step of isotropic chemical etching (FIGS. 11(j"), 11(k")) for a predetermined time enlarges the drilled pits H formed in the substrate, thus finally producing (FIG. 11(l")) a structure similar to that of FIG. 11(m').

Figure 13:
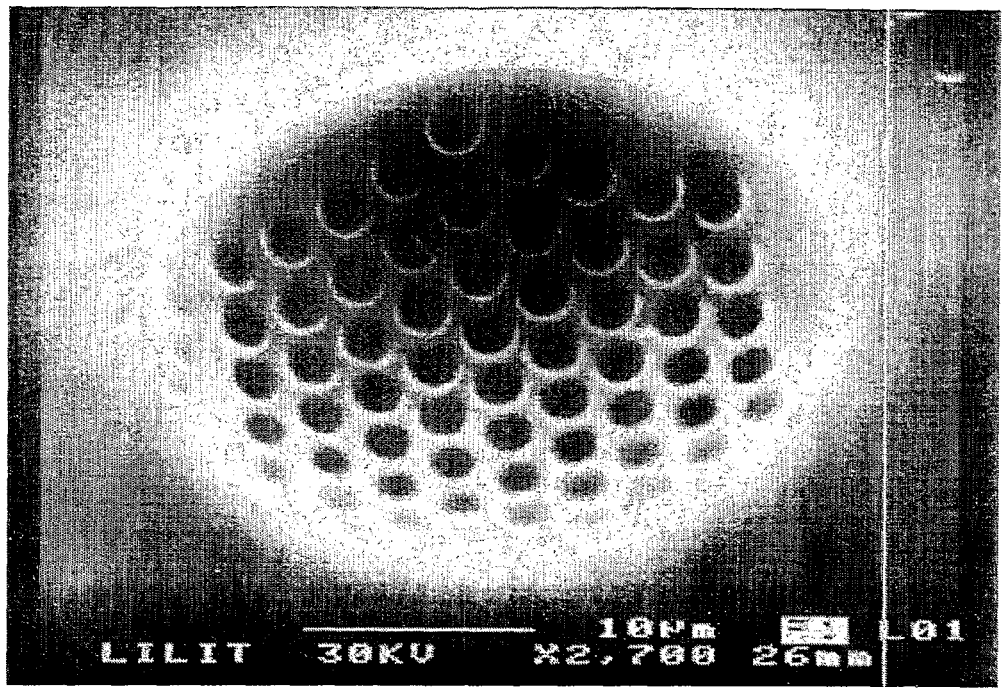
Figure 14:
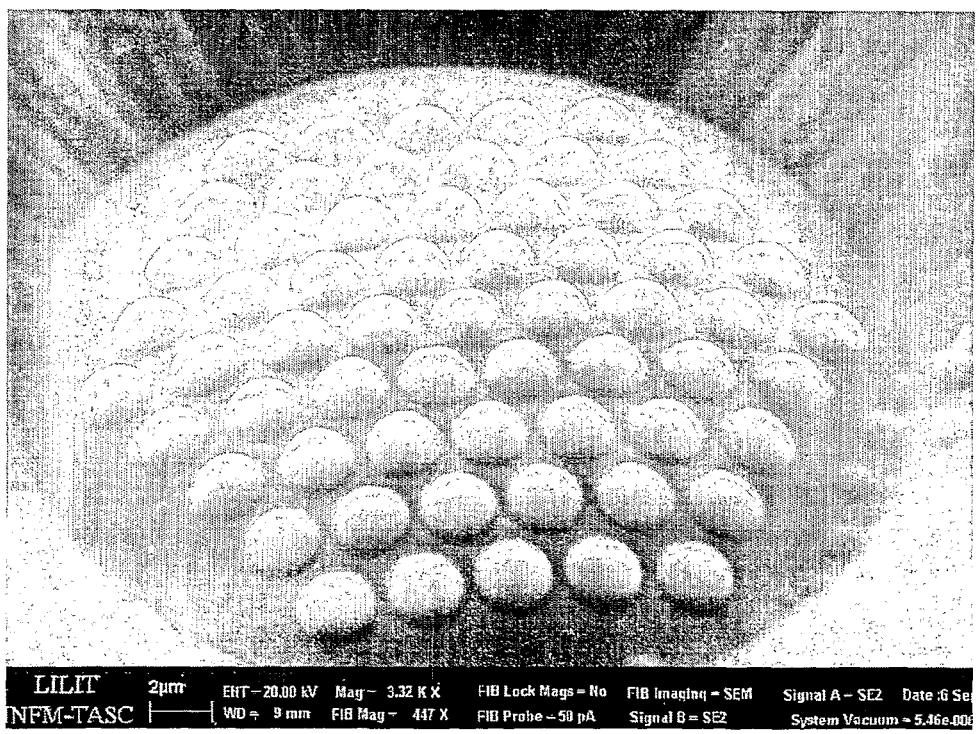

The image in FIG. 13 corresponds to the processing step shown in FIG. 11(j"). The mould which is produced, shown in section in FIGS. 11(m') and 11(l"), can then be used for structuring a plastics material by the methods of nano-imprint lithography, injection moulding or step & flash lithography, to produce a structure as shown in FIG. 14, comprising a plurality of lenticules formed on a spherical convex surface.

The freedom of design of optical components can be increased advantageously by adding further steps of processing of the three-dimensional structure fabricated by the method proposed by the invention.

For example, it is possible to act directly on the moulded plastics material to remove portions which have been predefined by a lithographic method (such as X-ray lithography), by means of a step of selective development of the material, to form incisions, slots and other cavities. This has been found suitable for the formation of even more complex structures, such as arrays of nanocolumns of modulated height for microfluidics applications, or the combination of refractive and diffractive optics by the creation of slots in the convex microlenses produced by the methods described above.

The method proposed by the invention can also include the transposition of the impression area reproduced on the mould to at least one additional transfer substrate which can be used, in turn, as a mould for the structuring of different materials. In a first example, the impression area can be transposed in negative form to a transfer substrate by electrolytic nickel growth within this impression area, for the subsequent forming of a body of molten glass. In a second example, the same body of structured plastics material can be used as a relief impression for a step of electrolytic nickel growth and the fabrication of a metal mould having a concave impression entirely similar to that of the original mould, again for the subsequent forming of a body of molten glass.

In a third example, the impression area can be transposed in negative form to a transfer substrate by electrolytic nickel growth within this impression area. This transfer substrate can be used, in turn, to generate a further mould by the growth of materials such as diamond or silicon carbide by CVD or PECVD, or by the growth of tungsten by sputtering, making it possible to mould materials with high melting points.

Clearly, provided that the principle of the invention is retained, the forms of application and the details of construction can be varied widely from what has been described and illustrated purely by way of example and without restrictive intent, without departure from the scope of protection of the present invention as defined by the attached claims.

The invention claimed is:

1. Method for forming three-dimensional micro- and nano-structures, based on the structuring of a body of material by means of a mould having an impression area which reproduces the three-dimensional structures in negative form, comprising the operations of:
    providing a mould comprising a substrate of a material which can undergo isotropic chemical etching, in which the impression area is to be formed;
    defining an etching pattern on (in) the substrate comprising a plurality of etching areas having zero-, uni- or bidimensional extension, which can be reached by an etching agent; and
    carrying out a process of isotropic chemical etching of the substrate from the etching areas for a corresponding predetermined time, so as to produce cavities which in combination make up the impression area.

2. Method according to claim 1, wherein successive etching steps take place from new etching areas and enlarged etching areas obtained by at least one preceding etching step carried out from pre-existing etching areas.

3. Method according to claim 1, wherein the etching areas are defined by selective masking of the surface of the substrate in a pattern corresponding to the geometry of the desired etching areas.

4. Method according to claim 3, wherein the selective masking includes the operations of:
    applying a protective layer to an extended area of the surface of the substrate; and
    selectively removing areas of the protective layer and exposing etching areas of the substrate.

5. Method according to claim 4, wherein the selective removal of the protective layer is carried out by physical etching methods by means of focused ion beams.

6. Method according to claim 3, wherein the selective removal of the protective layer is carried out by lithography and includes the operations of:
    applying an upper layer of resist to the protective layer;
    selectively exposing the resist;
    developing and selectively removing the exposed resist;
    etching the protective layer by chemical etching in areas of removal of the resist, and exposing the etching areas of the substrate.

7. Method according to claim 3, wherein the selective masking changes over time and forms a primary pattern corresponding to the geometry of first etching areas and at least one secondary pattern comprising second etching areas.

8. Method according to claim 7, wherein the secondary pattern additionally comprises enlarged etching areas obtained by a preceding etching step carried out from the first etching areas.

9. Method according to claim 1, wherein the etching areas are defined by physical etching methods which can produce a cut into the substrate.

10. Method according to claim 9, wherein the physical etching methods comprise milling etching by focused ion beams.

11. Method according to claim 9, wherein the physical etching methods comprise a step of defining a surface pattern corresponding to the geometry of the desired etching areas by optical, electron or X-ray lithography and a subsequent step of plasma etching of the substrate.

12. Method according to claim 11, wherein the unidimensional or bidimensional etching areas have variable depths of cut.

13. Method according to claim 9, wherein the etching areas have different depths of cut.

14. Method according to claim 1, wherein the material of the substrate is a non-crystalline material which is isotropic with respect to the properties of response to etching by any chemical agent.

15. Method according to claim 1, wherein the material of the substrate is a crystalline material which is isotropic with respect to the properties of response to etching by predetermined etching chemical agents.

16. Method according to claim 1, wherein the operation of structuring the material by moulding is a process of imprint lithography applied to plastics or cross-linkable polymers.

17. Method according to claim 1, wherein the operation of structuring the material by moulding is an injection moulding method.

18. Method according to claim 1, wherein the operation of structuring the material by moulding is a step and flash lithography process.

19. Method according to claim 1, wherein the substrate of the mould is quartz, glass or other silicon oxide.

20. Method according to claim 1, wherein the material is a thermoplastic or cross-linkable polymer.

21. Method according to claim 1, wherein the etching agent contains hydrofluoric acid.

22. Method according to claim 1, wherein the three-dimensional structures comprise adjacent, intersecting and/or overlapping convex formations which form refractive optical elements.

23. Method according to claim 1, comprising a further step of micro- or nanoprocessing for producing cuts or perforations in the structured material, forming diffraction apertures.

24. Method according to claim 1, comprising a further step of electrolytic growth of metallic elements within the impression area of the mould or on the moulded three-dimensional structures, for forming a transfer substrate which reproduces the three-dimensional structures, intended for use as a mould for reproducing the three-dimensional structures in negative form.

25. Assembly of microlenses with a convex three-dimensional structure, of the refractive or hybrid refractive/diffractive type, including a plurality of adjacent, intersecting and/or overlapping lenses for forming images on different focal planes, obtained by the method specified in claim 1.

* * * * *